(12) United States Patent
Yang

(10) Patent No.: US 6,498,387 B1
(45) Date of Patent: Dec. 24, 2002

(54) WAFER LEVEL PACKAGE AND THE PROCESS OF THE SAME

(75) Inventor: Wen-Ken Yang, No. 47, Lane 6, An-Kan St., Hsin-Chu City (TW)

(73) Assignee: Wen-Ken Yang, Hsin-Chu (TW)

( * ) Notice: Subject to any disclaimer, the term of this patent is extended or adjusted under 35 U.S.C. 154(b) by 0 days.

(21) Appl. No.: 09/505,938

(22) Filed: Feb. 15, 2000

(51) Int. Cl.[7] .............................................. H01L 23/544
(52) U.S. Cl. ...................... 257/620; 257/612; 257/678; 257/753
(58) Field of Search ................................ 257/753, 612, 257/678, 620; 438/113, 458, 462

(56) References Cited

U.S. PATENT DOCUMENTS

| | | | | |
|---|---|---|---|---|
| 5,338,967 A | * | 8/1994 | Kosaki ......................... | 257/620 |
| 5,414,297 A | * | 5/1995 | Morita et al. ................ | 257/503 |
| 5,959,354 A | * | 9/1999 | Smith et al. ................. | 257/202 |
| 6,153,941 A | * | 11/2000 | Maejima ...................... | 257/620 |
| 6,201,304 B1 | * | 3/2001 | Moden ......................... | 257/774 |
| 6,208,519 B1 | * | 3/2001 | Jiang ........................... | 361/717 |
| 6,268,655 B1 | * | 7/2001 | Farnworth et al. .......... | 257/618 |
| 6,326,701 B1 | * | 12/2001 | Shinogi et al. ............... | 257/620 |
| 6,329,288 B1 | * | 12/2001 | Tokushige et al. ........... | 438/675 |

FOREIGN PATENT DOCUMENTS

JP          356032753 A     *  4/1981

\* cited by examiner

*Primary Examiner*—Olik Chaudhuri
*Assistant Examiner*—Nathan W. Ha
(74) *Attorney, Agent, or Firm*—Blakely Sokoloff Taylor & Zafman

(57) ABSTRACT

The present invention includes polishing the wafer backside by a grinder. Subsequently, a glass is laminated on the wafer backside surface by using epoxy. Then, the wafer is etched to isolate the dies. An epoxy is then coated on the wafer by means of vacuum coating process. Then, a curing step is performed by using the ultraviolet (UV) radiation to harden the epoxy. A grinding process is optional used to grind the epoxy on the wafer circuit side. A plurality of pad openings is formed in the epoxy. Subsequently, a pad circuit re-distribution is arranged over the upper surface of the epoxy. A solder mask covers the epoxy and the pad circuit for isolation. A printing process is carried out to print solder on the pre-determined area and the solder contacts to the pad circuit. Then, the solder is re-flow, and the wafer is then set to a testing apparatus for wafer level testing. A sawing process is next performed after the wafer-level test to separate the dies by cutting the scribe line, thereby obtaining the chip scale package (CSP).

5 Claims, 7 Drawing Sheets

US 6,498,387 B1

WAFER LEVEL PACKAGE AND THE PROCESS OF THE SAME

FIELD OF THE INVENTION

The present invention relates to a semiconductor package, and more specifically, to a wafer level packaging technology and the method of forming the wafer level package.

BACKGROUND OF THE INVENTION

In recent years, since the circuit devices in a chip are manufactured with a high density and it has been a trend to make semiconductor devices having small size. IC (integrated circuits) designers are tempted to scale down the size of each device and increase chip integration in per unit area. Typically, the semiconductor devices require protection from moisture and mechanical damage. The structure involves the technology of package. In the technology, the semiconductor dies or chips are usually individually packaged in a plastic or ceramic package. The package is required to protect the die and spread the heat generated by the devices. Therefore, the heat dissipation is very important in the semiconductor devices, particularly the power and the performance of the device increase. The conventional package is also used for performing full functionality testing of the chip. It is important that each device is kept as small as possible. Recently, there has existed a high interest of developing a package with a larger number of input and output. One of the solutions is to develop devices with ball grid array (BGA) and assembly technology. It is because that the renewed desire in high density hybrid is driven by the requirement of larger numbers of electrical connections, the increasing clock rate of digital systems.

Various types of package have been developed, recently. No matter what type of the package is, most of the packages are divided into individual chips before they are packaged. However, the wafer level packaging is a trend for the semiconductor package. One of the prior arts is shown below. Turning to FIG. 1, a plurality of dies 4 are formed on a surface of a semiconductor wafer 2. A glass 8 is attached on the surface of the wafer 2 having dies formed thereon by using an adhesive material 6. Then, the other surface of the wafer 2 without the dies is ground to reduce the thickness of the wafer 2, which is called back grinding, as shown in FIG. 2. Next, the wafer is then etched to isolate the ICs and a portion of the adhesive material 6 is exposed. This can be found in FIG. 3 and please turn to FIG. 4, a further glass 12 is attached on the surface that is opposite to the surface having dies 4 by another adhesive material 10. The next step is shown in FIG. 5, compliant layers 14 is formed on the top of the first glass followed by etching a portion of the first glass 8 and into the adhesive material 6 and 10, as shown in FIG. 6. This step is called notch process, thereby forming a trench 16 in the glass 8 and the adhesive material 6, 10. Over the compliant layer 14, solder balls will be formed thereon during the subsequent steps.

A layer 18 formed of lead is patterned on the surface of the first glass 8 and along the surface of the trench 14 for providing electrical connection. The layer 18 also covers the compliant layers 14, as shown in FIG. 7. Referring to FIG. 8, a solder mask 20 is successively formed over the surface of the lead layer 18 and the glass 8 to expose the surface aligned to the compliant layer 14. Therefore, the solder mask 20 exposes the lead over the compliant layer 14. Turning to FIG. 9 and FIG. 10, solder balls 22 are then implanted on the surface of the exposed lead 18, which is exposed by the solder mask 20 by a conventional process of implanting balls. The final step is to perform the dice process to etch the adhesive material 10 through the second glass 12 via the trench 16 resulting in the dies being separated. As known in the art, a dicing tape 24 is attached on the second glass before the step is used.

However, the process is too complicated. It needs the notch process and the step of etching the second glass 12 to separate the dies. Further, it includes the formation of the trench having a sharp profile. The lead formed thereon is not readily attached on the surface that will lead to open circuits. Hence the performance of the device is degraded.

SUMMARY OF THE INVENTION

An object of the present invention is to provide a package which has the real chip size package.

A further object of the present invention is to provide a package with a lower cost of manufacture and the purpose of the present invention is to disclose the wafer level package and the process of the same.

A yet object of the present invention is to make the package that is adapted to the wafer level burn-in test and the final test.

The present invention includes polishing the wafer backside by a grinder or the like. Subsequently, a material such as glass is laminated on the wafer backside surface of the wafer by using epoxy. The glass can be attached by using laminate process. Quartz or ceramic can replace the glass. Then, the wafer (or silicon) is etched to isolate the dies. An adhesive material with 1–2 mil is then coated on the second side of the wafer by means of vacuum coating process using epoxy. Then, a curing step is performed by using the ultraviolet (UV) radiation to harden the epoxy. A lapping (grinding) process is optional used to grind the epoxy on the wafer circuit side.

A plurality of openings are formed in the adhesive material and aligned to the pads of the dies (chips). Subsequently, a pad circuit re-distribution is arranged over the upper surface of the epoxy. The pad circuit can be composed of any conductive layer such as metal, alloy or the like. Preferably, the pad circuit is formed of Cr—Cu alloy. A solder mask covers the epoxy and the pad circuit for isolation. A printing process is carried out to print solder on the pre-determined area and the solder contacts to the pad circuit. Then, the solder is re-flow at a temperature as known in the art. Then, the wafer is set to a testing apparatus for wafer level testing. A sawing process is next performed after the wafer-level test to separate the dies by cutting the scribe line, thereby obtaining the chip scale package (CSP).

A wafer level package of the present invention comprising a wafer having a plurality of dies formed thereon, wherein the wafer has a trench formed therein and over a scribe line. A glass is attached on the backside surface of the wafer by a first epoxy. A second epoxy is formed over the plurality of dies and refilled into the trench, wherein the plurality of dies has a plurality of pads formed thereon, A circuit layout is re-distribution on the second epoxy and connected to the plurality of pads. A solder mask is formed on the circuit layout and the second epoxy to expose a portion of the circuit layout. A solder ball is formed on the exposed portion and connected to the circuit layout.

DETAILED DESCRIPTION OF THE PREFERRED EMBODIMENT

Figure 1:
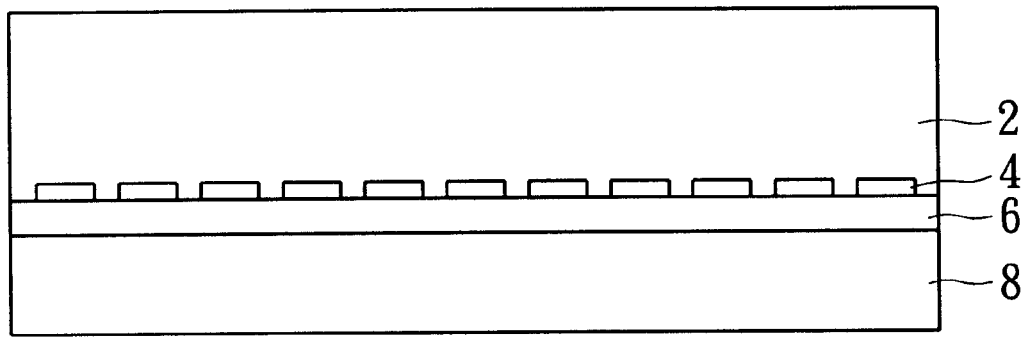
FIGS. 1–10 are cross sectional views of the prior art.
Figure 2:
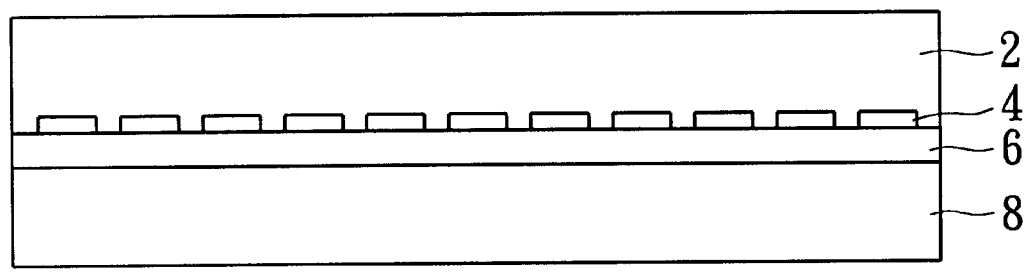
Figure 3:
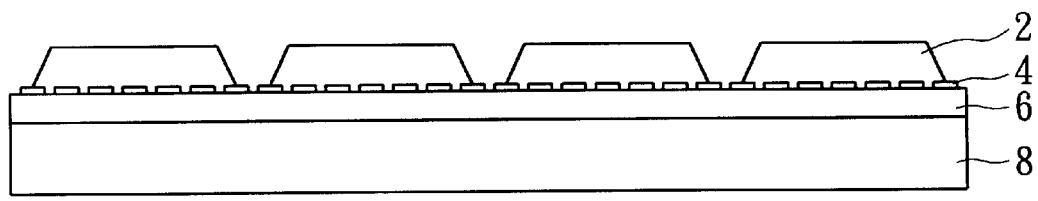
Figure 4:
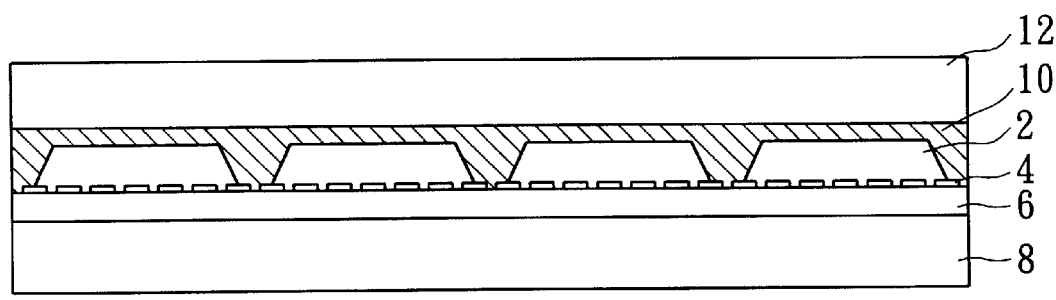
Figure 5:
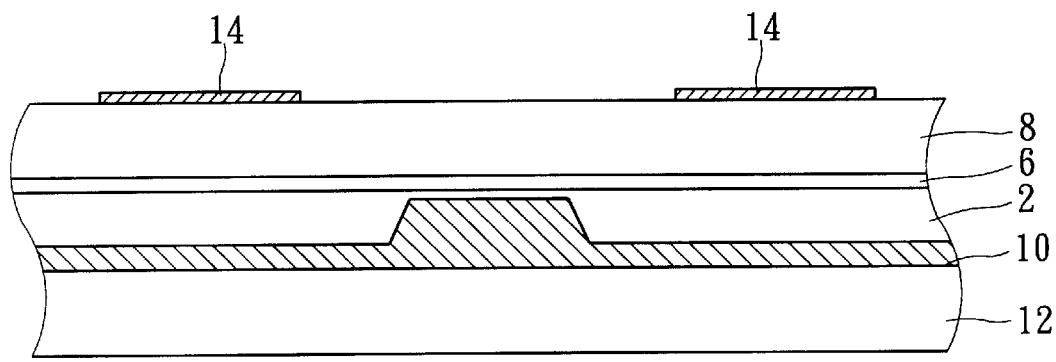
Figure 6:
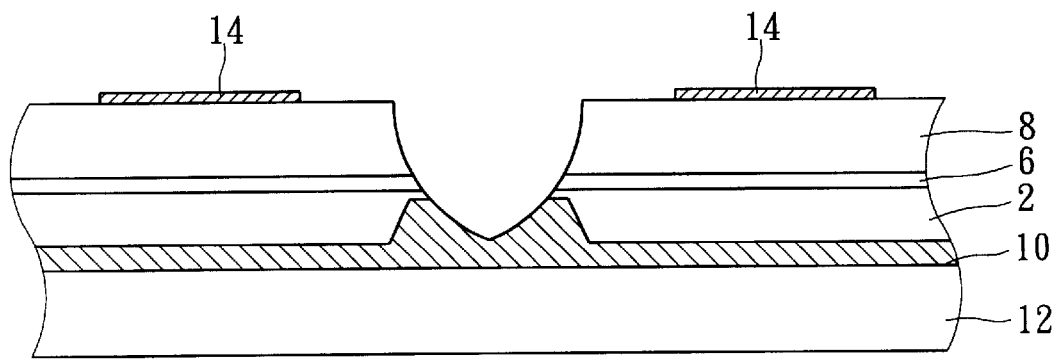
Figure 7:
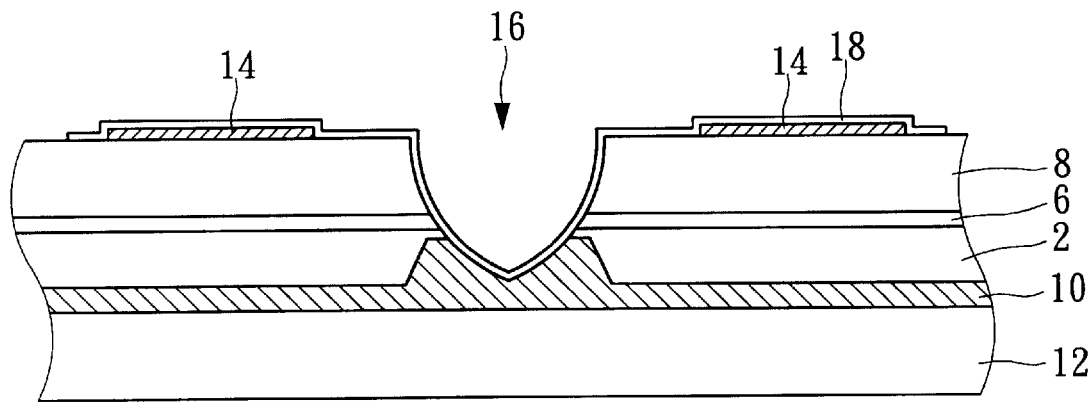
Figure 8:
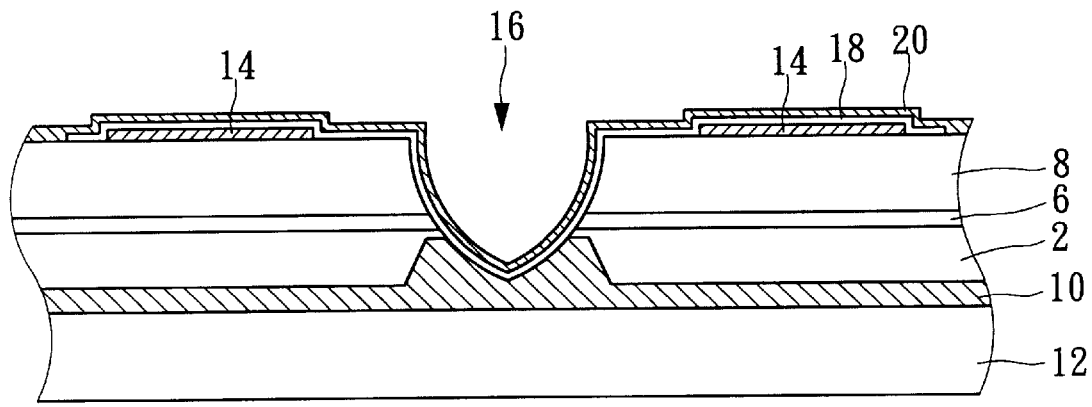
Figure 9:
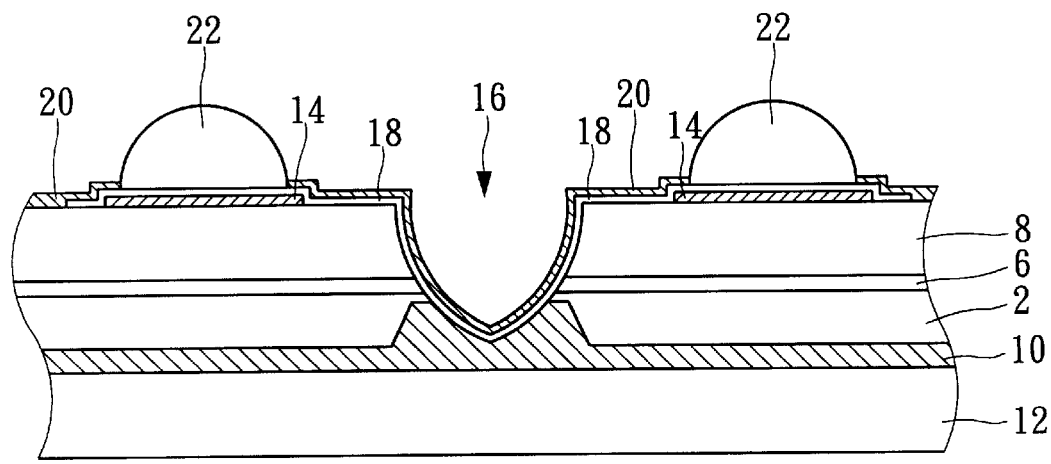
Figure 10:
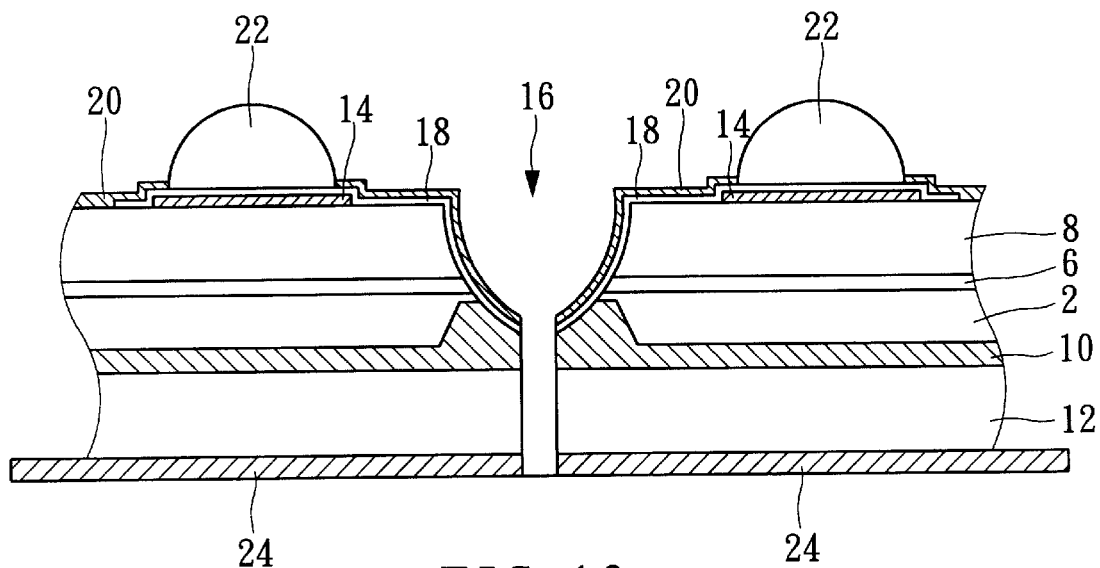

The present invention discloses a novel method of forming a wafer level package and the structure of the wafer level package. The detailed description is described as follows. The description and the drawing illustrate the embodiment of the present invention, but the present invention is not limited by the embodiment. As illustrated in FIG. 1, a wafer backside (or first side) is initially polished or ground by a grinder or the like. Before the step is applied, a wafer taping is used to attach a tape on the wafer and the tape is removed after the wafer is laminated a material such as glass thereon. Preferably, the thickness of the wafer after lapping is about 6–8 mil. Subsequently, a material such as glass 1 is laminated on the wafer backside surface of the wafer 5 having a plurality of dies by using any suitable material 3 that includes but not limited to epoxy. The glass 1 can be attached by using laminate process disclosed by prior art or the like. Preferably, the thickness of the glass 1 is approximately 1–2 mil. But the actual thickness of the glass depends on the other parameters of the process. Quartz or ceramic can replace the glass 1. The selected material used in the laminate process has a thermal expansion coefficient (TEC) that is close to the one of the silicon. Typically, the TEC of the silicon is about 3, and the one of the glass is approximate 3–5.

Then, the wafer (or silicon) is etched by using a photoresist mask (not shown) having a specific pattern to isolate the ICs. Preferably, the openings of the photoresist mask are aligned to the scribe line 7 formed on the surface of the wafer, thereby exposing the scribe line. In a preferred embodiment, the silicon is etched by using wet etch such that the trench 9 generated by the step having a slope profile. As known in the art, the above result can be easily obtain by controlling the recipe of the etching.

Figure 11:
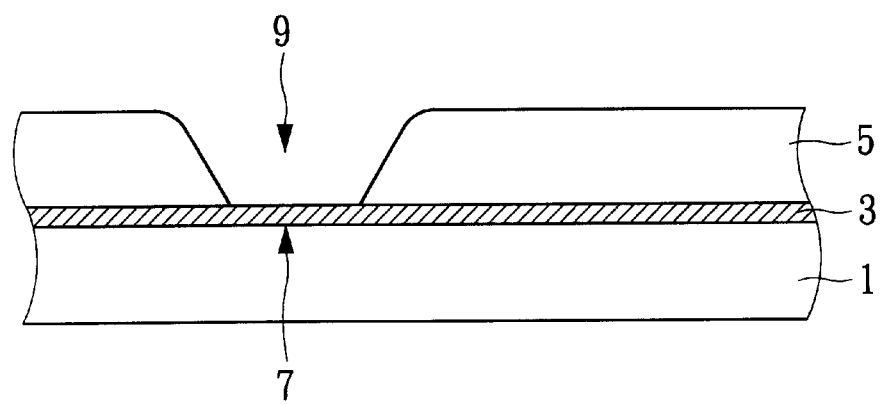
FIG. 11 is a cross sectional view of a semiconductor wafer illustrating the steps of laminating a glass on the backside surface of a wafer and etching the wafer according to th present invention.
Figure 12:
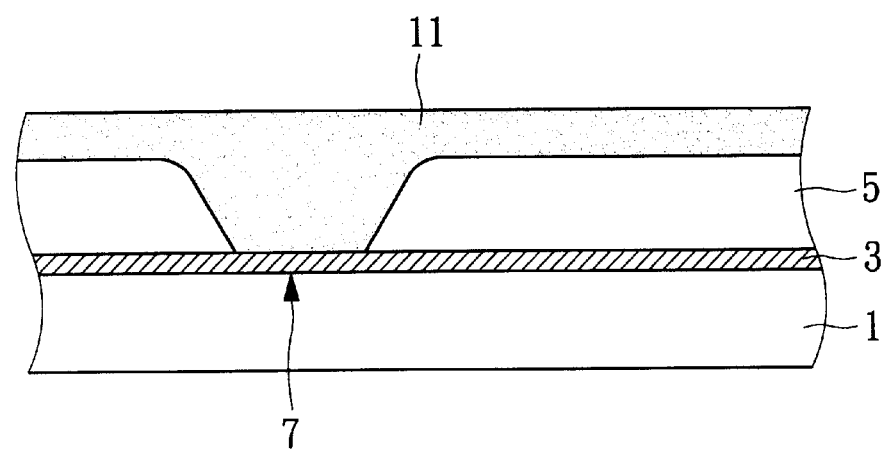
FIG. 12 is a cross sectional view of a semiconductor wafer illustrating the step of vacuum coating an epoxy on the wafer according to the present invention.
Figure 13:
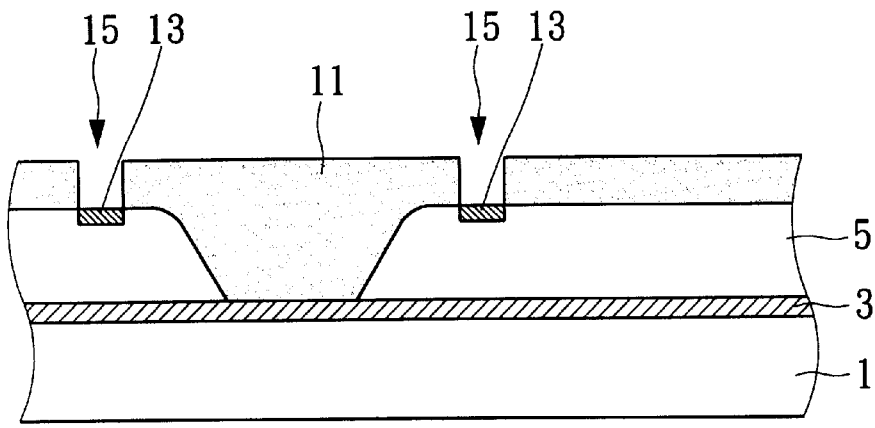
FIG. 13 is a cross sectional view of a semiconductor wafer illustrating the step of opening the pad open by laser according to the present invention.

Turning to FIGS. 11 to 13, an adhesive material 11 with 1–2 mil is then coated on the second side of the wafer 5, that is preferably done by means of vacuum coating process using but not limited to epoxy. The step is similar to the formation of the tape as typical used. The vacuum coating epoxy process prevents the formation of bubbles in the epoxy and the epoxy will refill into the trench 9 automatically. Then, a curing step is performed by using the ultraviolet (UV) radiation to harden the epoxy. Alternatively, a thermal process may be used to cure the material. A lapping (grinding) process is optional used to grind the epoxy on the wafer circuit side.

A plurality of openings 15 are formed in the adhesive material 11 and aligned to the pads 13 of the dies (chips). Consequently, the pads 13 on the chip are exposed. It has to be note, the epoxy is transparent to the laser, and thus the alignment mark on the scribe line will not be covered by the epoxy. In other words, the alignment mark is visible to the alignment tool for subsequent alignment. Further, the adhesive material 11 exhibits the characteristic of flowable and has the moisture resistant.

Figure 14:
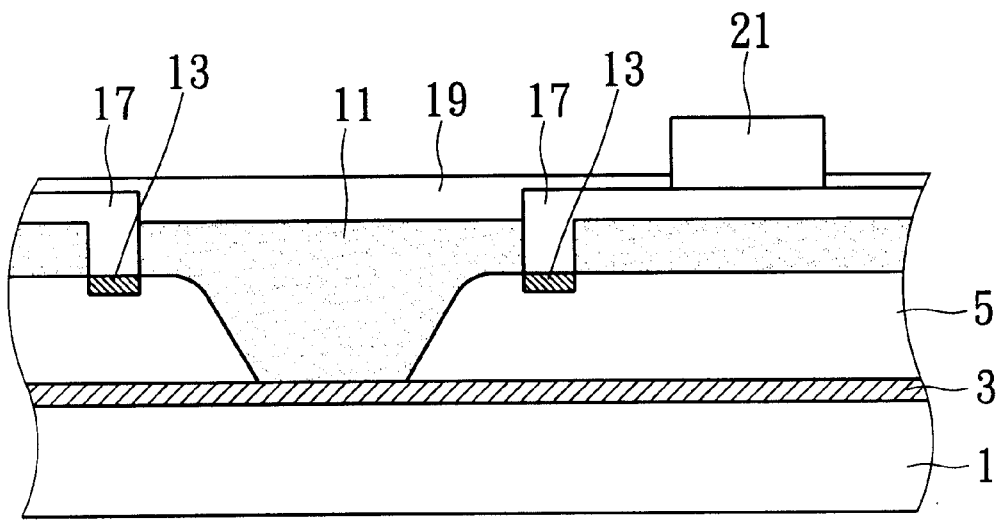
FIG. 14 is a cross sectional view of a semiconductor wafer illustrating the steps of re-distribution the pad circuit, forming a solder mask and printing the solder according to the present invention.
Figure 15:
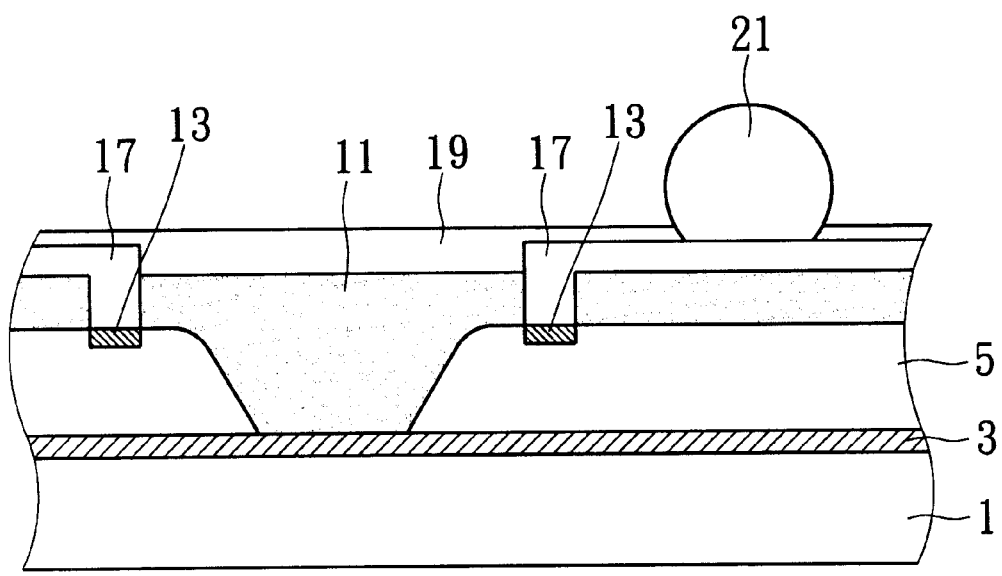
FIG. 15 is a cross sectional view of a semiconductor wafer illustrating the step of re-flowing the solder according to the present invention.

Subsequently, a conductive trace layout or so-called pad circuit re-distribution is arranged over the upper surface of the epoxy 11, as illustrated in FIG. 14. The pad circuit 17 can be composed of any conductive layer such as metal, alloy or the like. Preferably, the pad circuit 17 is formed of Cr—Cu alloy. As known, a portion of the pad circuit contacts to the pads 13 for electrically connection. Still turning to FIG. 14, a solder mask 19 covers the epoxy 11 and the pad circuit 17 for isolation. The solder mask 19 exposes a desired portion of the pad circuit, the exposed area of the pad circuit 17 is pre-determined to locate solder balls as an electrically connecting terminal. A printing process is carried out to print solder 21 on the pre-determined area and the solder 21 contacts to the pad circuit 17. Then, the solder 21 is re-flow at a temperature as known in the art to obtain a spherical shape, as shown in FIG. 15. The semiconductor die 5 is coupled to solder ball 21 by pad circuit or conductive traces 17. The solder ball 21 can be formed by typical ball grid array (BGA) technique. Preferably, the solder balls 21 are configured in a matrix form. Typically, the solder balls 21 are connected with the circuit so as to establish an electrical connection.

Then, the wafer is set to a testing apparatus for wafer level testing such as burn-in test. A sawing process is next performed after the wafer-level test to separate the dies by cutting the scribe line, thereby obtaining the chip scale package (CSP).

Following table is the comparison between the wafer level SCP and the chip level CSP.

TABLE 1

| Wafer level CSP | Chip level CSP |
| --- | --- |
| Whole wafer packaging | Individual chip packaging |
| Max size extends to die street | Max size: die size +20 |
| Economy of scale | Costly |
| 0.1 to 0.5 cent/lead | 1 to 5 cent/lead |

Table 2 is the comparison among the percent wafer level package and other technology.

TABLE 2

| | The Present CSP | Tessera (micro-BGA) | Rigid laminate |
| --- | --- | --- | --- |
| Cost (cent/lead) | Wafer level; batch processing 0.5 C/L | Individual die packaging; 1 C/L | Individual die packaging 1 C/L |
| Product design | Initial invest 10 k; Flexible change; change cycle: in one day | Initial invest 50 k; Expensive to modify; Change cycle: months | Initial invest 30 k Expensive to modify; Change cycle: months |
| Entry cost | Medium: Wafer fab. equipment availability | Medium | Low |
| Reliability | "real" package withstands humidity, temperature, cycle | Silicon exposed on one side | Glob top on flex |

TABLE 2-continued

| | The Present CSP | Tessera (micro-BGA) | Rigid laminate |
|---|---|---|---|
| | and bake | | |
| Configuration | BGA | BGA | BGA |
| Flexibility | Only change mask | Need new interposer design and manufacture | Need "board" design and manufacture |
| Dimension | Die size | Larger than die size | Up to 20 more than die size |
| Die shrink | Accommodate, layout close to edge (30 u) | Limit space, layout 300 u from edge | Limit space, wire bonding compensates for shrinkage |
| Process | Wafer fab. + others | TAB/lead bond | Wire bond/Flip chip |
| Application | Memory, logic, ASIC, IPC, smart media, analog, RF | Memory, logic | Memory, Logic |
| Pin count | 200 pins | 200 pins | No limit |
| Center pads | Super | Not easy | Okay |

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. Thus, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A wafer level package, said wafer level package comprising:
    a wafer having a plurality of dies formed thereon, wherein said wafer has a trench formed on a first side surface of said wafer and over a scribe line;
    a material attached on a second side surface of said wafer by a first adhesive material, wherein said material attached on said second side surface of said wafer is selected from the group of glass, quartz or ceramic;
    a second adhesive material formed over said plurality of dies and refilled into said trench, wherein said plurality of dies has a plurality of pads formed thereon;
    a circuit layout formed on and contacting an upper surface of said second adhesive material and connected to said plurality of pads;
    a solder mask covered on said circuit layout and said second adhesive material to expose a portion of said circuit layout; and
    solder balls formed on said exposed portion and connected to said circuit layout.

2. The wafer level package of claim 1, wherein said first adhesive material comprise epoxy.

3. The wafer level package of claim 1, wherein said second adhesive material comprise epoxy.

4. The wafer level package of claim 1 wherein said circuit layout is formed so that said circuit layout is completely disposed outside of said trench.

5. The wafer level package of claim 1 wherein said circuit layout contacts said second adhesive layer at portions that are positioned laterally above said trench.

* * * * *